(12) United States Patent
Kim et al.

(10) Patent No.: US 11,231,656 B2
(45) Date of Patent: Jan. 25, 2022

(54) TARGET DEBRIS COLLECTION DEVICE AND EXTREME ULTRAVIOLET LIGHT SOURCE APPARATUS INCLUDING THE SAME

(71) Applicant: Samsung Electronics Co., Ltd., Suwon-si (KR)

(72) Inventors: Sunghyup Kim, Hwaseong-si (KR); Ho Yu, Yongin-si (KR); Jeonggil Kim, Hwaseong-si (KR); Minseok Choi, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/835,708

(22) Filed: Mar. 31, 2020

(65) Prior Publication Data

US 2021/0059035 A1 Feb. 25, 2021

(30) Foreign Application Priority Data

Aug. 23, 2019 (KR) .................. 10-2019-0103855

(51) Int. Cl.
*G03F 7/20* (2006.01)
*H05G 2/00* (2006.01)
*G21K 1/06* (2006.01)

(52) U.S. Cl.
CPC ...... *G03F 7/70916* (2013.01); *G03F 7/70033* (2013.01); *G03F 7/70891* (2013.01);
(Continued)

(58) Field of Classification Search
CPC .......... H05G 2/00–2/0008; G03F 7/70; G03F 7/70033; G03F 7/70891; G03F 7/70916;
(Continued)

(56) References Cited

U.S. PATENT DOCUMENTS

| 7,459,708 B2 | 12/2008 | Inoue et al. |
| 7,479,645 B2 | 1/2009 | Yabuta et al. |

(Continued)

FOREIGN PATENT DOCUMENTS

| JP | 2005-197081 | 7/2005 |
| JP | 2005-0197081 A | 7/2005 |

(Continued)

OTHER PUBLICATIONS

English translation of WO2016/006162, published Jan. 14, 2016. (Year: 2016).*

*Primary Examiner* — Christina A Riddle
(74) *Attorney, Agent, or Firm* — Harness, Dickey & Pierce, P.L.C.

(57) ABSTRACT

A target debris collection device for extreme ultraviolet (EUV) light source apparatus, includes a baffle body extending within an EUV vessel between a collector and an outlet port of the EUV vessel to allow EUV light reflected from the collector to pass through an internal transmissive region thereof, a discharge plate provided in a first end portion of the baffle body adjacent to the collector to collect the target material debris on an inner surface of the baffle body, a guide structure to guide the target material debris collected in the discharge plate to a collection tank, and a first heating member provided in the guide structure to prevent the target material debris from being solidified.

20 Claims, 8 Drawing Sheets

(52) U.S. Cl.
CPC ............... G21K 1/06 (2013.01); H05G 2/005 (2013.01); H05G 2/008 (2013.01)

(58) Field of Classification Search
CPC ............... G03F 7/7015; G03F 7/70175; G03F 7/70008; G03F 7/70016; G03F 7/70025; G03F 7/70166; G03F 7/702; G03F 7/70316; G03F 7/70808; G03F 7/70841; G03F 7/70858; G03F 7/70883; G03F 7/70908–70941; G03F 7/70991; G03F 1/24; G03F 1/78; G21K 1/06
USPC ............... 355/30, 46, 52–55, 66–71, 77; 313/231.31–231.61; 315/111.21–111.71; 430/8, 22, 30
See application file for complete search history.

(56) References Cited

U.S. PATENT DOCUMENTS

| | | | |
|---|---|---|---|
| 7,491,955 B2 | 2/2009 | Shiraishi | |
| 7,915,600 B2 | 3/2011 | Ueno et al. | |
| 2015/0338753 A1* | 11/2015 | Riepen | G03F 7/70008 250/504 R |
| 2016/0147160 A1* | 5/2016 | Franken | G03F 7/70033 355/67 |
| 2018/0376575 A1 | 12/2018 | Chien et al. | |
| 2019/0155179 A1* | 5/2019 | Wu | G03F 7/70025 |
| 2020/0004167 A1* | 1/2020 | Chen | G03F 7/70175 |
| 2021/0033983 A1* | 2/2021 | Chen | G03F 7/70033 |

FOREIGN PATENT DOCUMENTS

| | | | | |
|---|---|---|---|---|
| JP | 5182917 B2 | 4/2013 | | |
| WO | WO-2016006162 A1 * | 1/2016 | ........... | H01L 21/027 |

\* cited by examiner

TARGET DEBRIS COLLECTION DEVICE AND EXTREME ULTRAVIOLET LIGHT SOURCE APPARATUS INCLUDING THE SAME

PRIORITY STATEMENT

This U.S. non-provisional application claims the benefit of priority under 35 U.S.C. § 119 to Korean Patent Application No. 10-2019-0103855, filed on Aug. 23, 2019 in the Korean Intellectual Property Office (KIPO), the contents of which are herein incorporated by reference in their entirety.

BACKGROUND

Various example embodiments relate to a target debris collection device, an extreme ultraviolet light source apparatus including the same, an extreme ultraviolet light system, and/or a method for operating the extreme ultraviolet light source apparatus. More particularly, example embodiments relate to a target debris collection device capable of collecting target material debris formed in an extreme ultraviolet (EUV) vessel and an extreme ultraviolet light source apparatus including the same, etc.

In the manufacture of a semiconductor device, extreme ultraviolet (EUV) light may be adopted as a light source in EUV lithography. A laser produced plasma (LPP) source may irradiate a target source having one or more emission rays in the EUV range, e.g., tin, xenon or lithium, with a laser light to emit EUV light by an interaction with the target source and the laser light. When the target source is irradiated by the laser light, microparticles may be formed and deposited within an EUV vessel, and maintenance for collecting and removing the deposited target material debris may be performed in a manual manner. The maintenance of the EUV vessel may take a considerable amount of time, and thus productivity may be decreased.

SUMMARY

One or more example embodiments provide a target debris collection device capable of automatically collecting and removing target material debris formed within an EUV vessel.

One or more example embodiments provide an extreme ultraviolet light source apparatus including the same.

According to at least one example embodiment, a target debris collection device for extreme ultraviolet light source apparatus, includes a baffle body extending within an extreme ultraviolet (EUV) vessel between a collector and an outlet port of the EUV vessel, the baffle body configured to allow extreme ultraviolet light reflected from the collector to pass through an internal transmissive region of the baffle body, a discharge plate provided in a first end portion of the baffle body adjacent to the collector, the discharge plate configured to collect target material debris on an inner surface of the baffle body, a guide structure configured to guide the target material debris collected in the discharge plate to a collection tank, and a first heating member provided in the guide structure, the first heating member configured to heat the target material debris.

According to at least one example embodiment, an extreme ultraviolet light source apparatus includes a collector included in a vessel, the collector configured to reflect extreme ultraviolet light, a baffle assembly included in the vessel, the baffle assembly configured to allow the extreme ultraviolet light reflected from the collector to pass through an internal transmissive region of the baffle assembly, a guide structure configured to guide target material debris collected in the baffle assembly to a collection tank, and a first heating member provided in the guide structure, the first heating member configured to heat the target material debris.

According to at least one example embodiment, an extreme ultraviolet light source apparatus includes a collector included in a vessel, the collector configured to reflect extreme ultraviolet light, and a target debris collection device configured to collect target material debris within the vessel. The target debris collection device includes a baffle body between the collector and an outlet port of the vessel, the baffle body configured to allow the extreme ultraviolet light reflected from the collector to pass through an internal transmissive region of the baffle body, a discharge plate provided in a first end portion of the baffle body adjacent to the collector, the discharge plate configured to collect the target material debris within the baffle body, a guide structure configured to guide the target material debris collected in the discharge plate to a collection tank, the guide structure having a length between 100 mm and 300 mm, and a first heating member provided in the guide structure, the first heating member configured to heat the target material debris.

According to at least one example embodiment, a target debris collection device for an extreme ultraviolet light source apparatus may include a guide unit to guide target material debris collected in a baffle assembly to a collection tank. The guide unit may include at least one heating member configured to maintain a liquid and/or semi-liquid state of the target material debris, and/or impede, decrease the occurrence of, and/or prevent the liquid target material debris from becoming solidified.

Accordingly, according to one or more of the example embodiments, the target material debris deposited within an EUV vessel may not be solidified (e.g., the target material debris may be in a liquid and/or semi-liquid state), and therefore may be exhausted smoothly to the collection tank. Thus, maintenance time for removing the tin material deposited within the EUV vessel may be reduced greatly.

BRIEF DESCRIPTION OF THE DRAWINGS

Example embodiments will be more clearly understood from the following detailed description taken in conjunction with the accompanying drawings.

FIG. 1 is a cross-sectional view illustrating an exposure apparatus in accordance with at least one example embodiment.

FIG. 2 is a block diagram illustrating the extreme ultraviolet light source in accordance with at least one example embodiment.

FIG. 3 is a cross-sectional view illustrating a target debris collection device in accordance with at least one example embodiment.

FIG. 4 is a block diagram illustrating a heating device of the target debris collection device in FIG. 3 according to at least one example embodiment.

FIG. 5 is a perspective view illustrating a portion of a baffle assembly of the target debris collection device in FIG. 3 according to at least one example embodiment.

FIG. 6 is a perspective view illustrating a portion of a discharge plate of the baffle assembly in FIG. 5 according to at least one example embodiment.

FIG. 7 is a bottom view of the baffle assembly in FIG. 5 according to at least one example embodiment.

FIG. 8 is a perspective view illustrating a target debris collection device in accordance with at least one example embodiment.

FIG. 9 is a perspective view illustrating a first heating member of the target debris collection device in FIG. 8 according to at least one example embodiment.

FIG. 10 is a perspective view illustrating target material debris discharged along the first heating member of the target debris collection device in FIG. 8 according to at least one example embodiment.

FIG. 11 is a perspective view illustrating a target debris collection device in accordance with at least one example embodiment.

DETAILED DESCRIPTION

Hereinafter, various example embodiments will be explained in detail with reference to the accompanying drawings.

Figure 1:
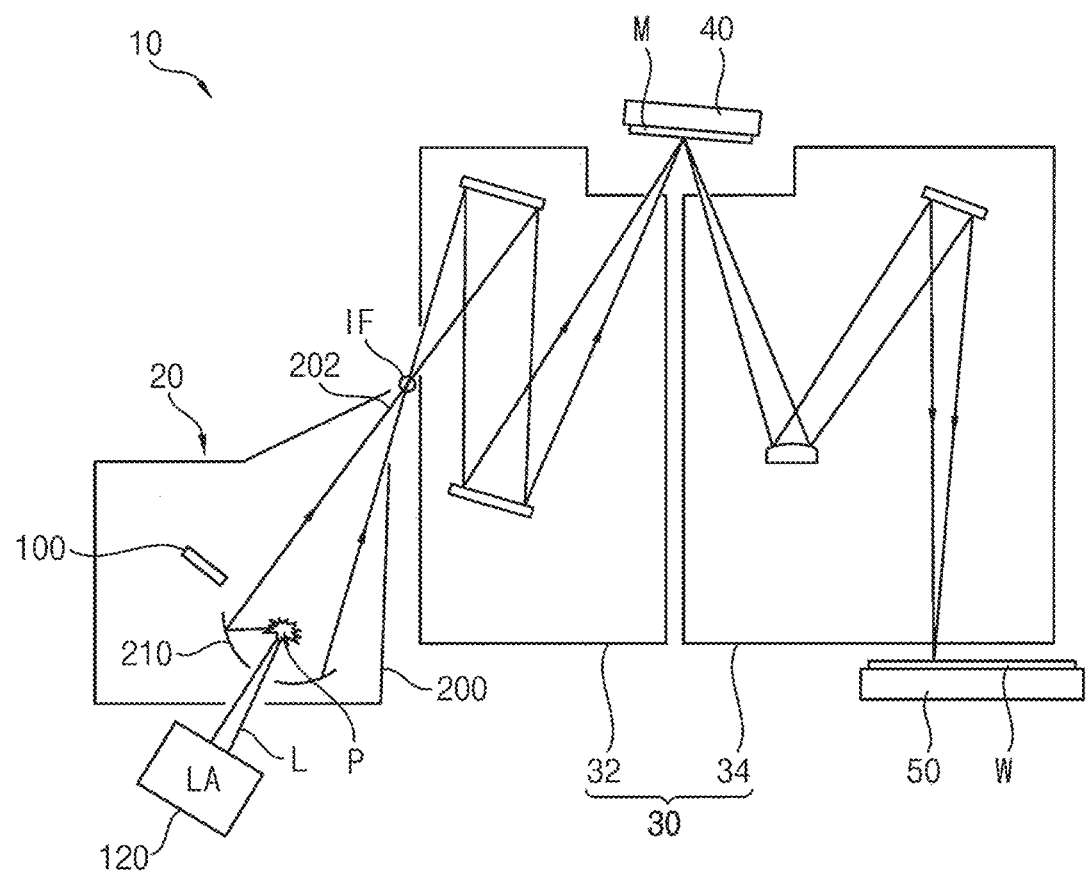
FIGS. 1 to 11 represent non-limiting, example embodiments as described herein.

FIG. 1 is a cross-sectional view illustrating an exposure apparatus in accordance with at least one example embodiment.

Referring to FIG. 1, an exposure apparatus 10 may include an extreme ultraviolet (EUV) light source apparatus 20, a mirror system 30, a mask stage 40 and/or a wafer stage 50, but is not limited thereto. The mirror system 30 may include an illumination mirror system 32 and/or a projection mirror system 34, etc.

In at least one example embodiment, the exposure apparatus 10 may perform a reflective photolithography process using a photomask M. For example, the exposure apparatus 10 may perform an extreme ultraviolet (EUV) exposure process, but is not limited thereto.

In particular, the extreme ultraviolet light source apparatus 20 may generate extreme ultraviolet (EUV) light, etc. For example, the extreme ultraviolet light source apparatus 20 may generate light having a wavelength of around 13.5 nm, for example, the wavelength of EUV light, using plasma, etc. A laser generator 120 may direct a laser light L to a target droplet to create a highly ionized plasma P, and the EUV radiation emitted from the plasma may be irradiated to the illumination mirror system of the mirror system 30 through a light collector 210.

The illumination mirror system 32 may include a plurality of illumination mirrors, but is not limited thereto. The illumination mirrors may condense the EUV light in order to decrease and/or reduce the loss of the EUV light which propagates out of the mirrored irradiating paths.

The mask stage 40 may mount the photomask M on a lower surface thereof and may move in a horizontal direction, but the example embodiments are not limited thereto. For example, the mask stage 40 may move in other directions and/or may mount the photomask M on other surfaces, etc. The photomask M may be mounted on a surface of the mask stage 40 such that a surface (of a front side) in which optical patterns of the photomask M are formed, may face in the direction of a projection mirror system 34, a semiconductor substrate, such as wafer W, etc.

The EUV light transferred from the illumination mirror system 32 may be irradiated to the photomask M mounted on the mask stage 40. The EUV light reflected from the photomask M mounted on the mask stage 40 may be transferred to the projection mirror system 34.

The projection mirror system 34 may receive the EUV light reflected from the photomask M and transfer the received EUV light to a wafer W (e.g., semiconductor wafer, semiconductor substrate, silicon substrate, etc.). The projection mirror system 34 may include a plurality of projection mirrors.

The wafer stage 50 may receive the wafer W and move in a horizontal direction, but is not limited thereto, and the wafer stage 50 may move in additional directions. For example, a photoresist layer having a desired and/or predetermined thickness may be formed on the wafer W, and the EUV light may be focused on the photoresist layer, etc. Accordingly, the exposure apparatus 10 may generate and emit the light onto the photoresist layer on the wafer W, thereby irradiating the photoresist layer. Thus, the photoresist layer may be partially and/or fully exposed based on the optical pattern information of the photomask M to form a photoresist pattern, and then a layer underlying the photoresist pattern may be partially and/or fully etched to form a pattern on the wafer W, doped in accordance with the photoresist pattern, and/or metallized in accordance with the photoresist pattern, etc.

Hereinafter, the extreme ultraviolet light source apparatus of the exposure apparatus in FIG. 1 will be explained.

Figure 2:
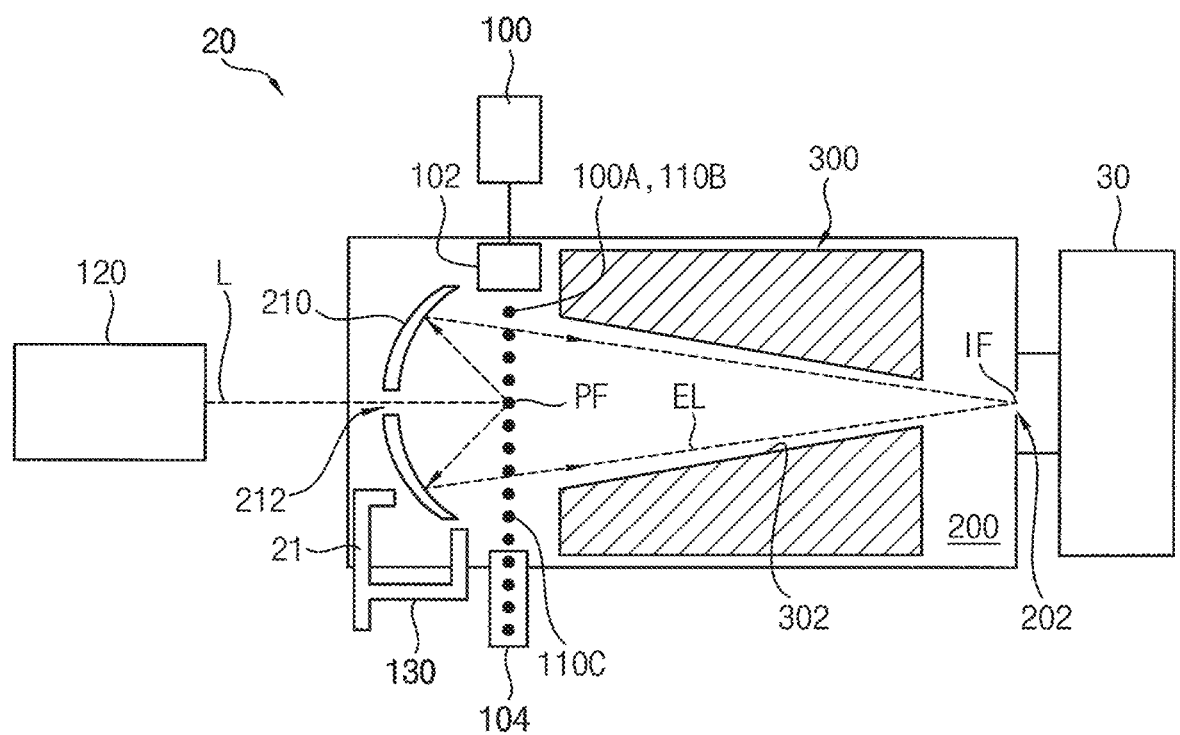

FIG. 2 is a block diagram illustrating the extreme ultraviolet light source apparatus in accordance with at least one example embodiment.

Referring to FIG. 2, the extreme ultraviolet light source apparatus 20 may include a collector 210 included in an EUV vessel 200 configured to collect and reflect extreme ultraviolet light, a target droplet generator 100 configured to generate and deliver target droplets into the collector 210, and/or a target debris collection device configured to collect target material debris within the EUV vessel 200, but the example embodiments are not limited thereto and may include a greater or lesser number of constituent elements. For example, the extreme ultraviolet light source apparatus 20 may further include a laser generator 120 configured to direct a laser light L to the target droplet injected into the collector 210, etc. Further, the extreme ultraviolet light source apparatus 20 may further include a purge gas supply portion configured to supply a purge gas into the collector 210 as well.

In at least one example embodiment, the target droplet generator 100 may generate source droplets 110A, 110B as a target source for generating extreme ultraviolet light. The target droplet generator 100 may inject the source droplets at a desired and/or predetermined period into the collector 210 through a nozzle 102. The target droplet generator 110 may deliver the droplets 110A, 110B of a target material into the interior of the EUV vessel 200 to an irradiation site, that is, a primary focus PF (e.g., a target, etc.) of the collector 210.

For example, the target droplet may include at least one element, e.g., xenon, lithium tin, etc., with one or more emission rays in the EUV wavelength range. The EUV emitting element may be in the form of liquid droplets and/or solid particles contained within the liquid droplets, etc. For example, the element tin may be used as pure tin, as a tin compound, e.g., $SnBr_4$, $SnBr_2$, $SnH_4$, as a tin alloy, e.g., tin-gallium alloys, tin-indium alloys, tin-indium-gallium alloys, or combinations thereof.

The laser generator 120 may irradiate the target droplet with the laser light L at the irradiation site in the EUV vessel 200. The laser generator 120 may direct the laser light L to the target droplet injected into the collector 210 to generate EUV light. The laser generator 120 may generate a $CO_2$ laser light and then the generated laser light may be focused to the irradiation site through a steering system. The laser light may react with, and vaporize, the target droplet to produce plasma P. The resulting plasma P may emit output radiation, e.g., EUV radiation and/or EUV light.

A target material catcher 104 may be installed to be opposite to the nozzle 102 of the target droplet generator 100, but is not limited thereto. The unused or un-irradiated droplets 110C may be collected in the target material catcher 104.

The collector 210 may include a reflection surface having the primary focus within or near the irradiation site to which the laser light is focused. According to some example embodiments the reflection surface may be an elliptical reflection surface, but is not limited thereto. The collector 210 may include an aperture 212. The aperture 212 may allow the laser light L to pass through to the irradiation site. The collector 210 may collect, reflect, and/or focus the EUV light (EL) to an intermediate focus IF, and then, the EUV light may be delivered to the mirror system 30 of the exposure apparatus.

The purge gas supply portion 130 may supply the purge gas, such as hydrogen gas, etc., into the EUV vessel 200 to transform the target material debris, such as tin, etc., deposited on the inner surfaces of the EUV vessel 200 and/or the collector 210 into volatile target material compounds, such as tin compound $SnH_4$, etc., to thereby purge the volatile target debris compounds (e.g., volatile tin compounds, etc.) from the EUV vessel 200.

The target debris collection device may include a baffle assembly 300 in the EUV vessel 200, and the target debris collection device may collect and/or exhaust the target material debris from the EUV vessel 200, e.g., microdroplets formed on the baffle assembly 300, etc. The baffle assembly 300 may include a series of passages and structures that receive, slow, and/or capture a portion of microparticles created when the target droplet is irradiated in the irradiation site. The baffle assembly may extend within the EUV vessel 200 from the collector 210 to an outlet port 202 of the EUV vessel 200, but is not limited thereto. The baffle assembly 300 may not impede, prevent, and/or otherwise occlude the EUV light (EL) from passing from the collector 210 through a three dimensional, cone-shaped transmissive region 302 to the intermediate focus IF.

Hereinafter, the target debris collection device will be explained.

Figure 3:
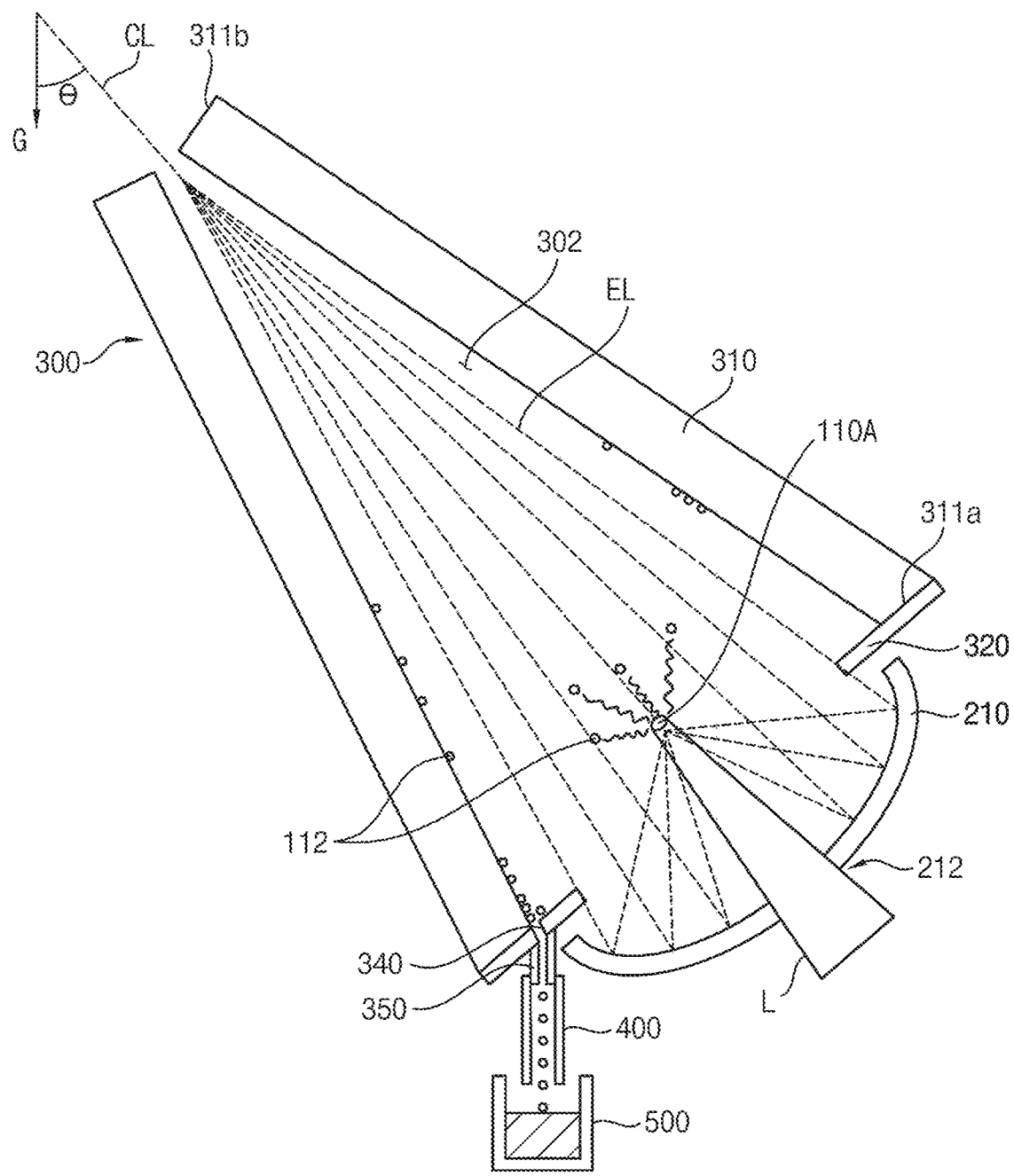
Figure 4:
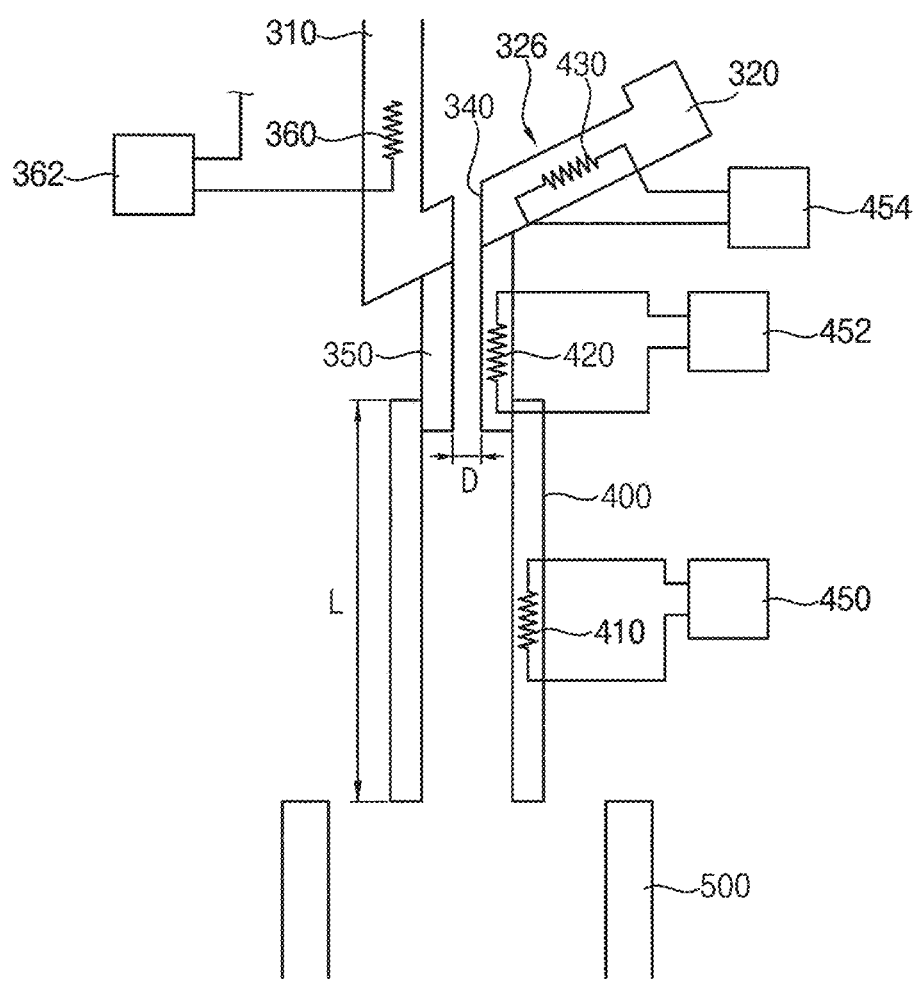
Figure 5:
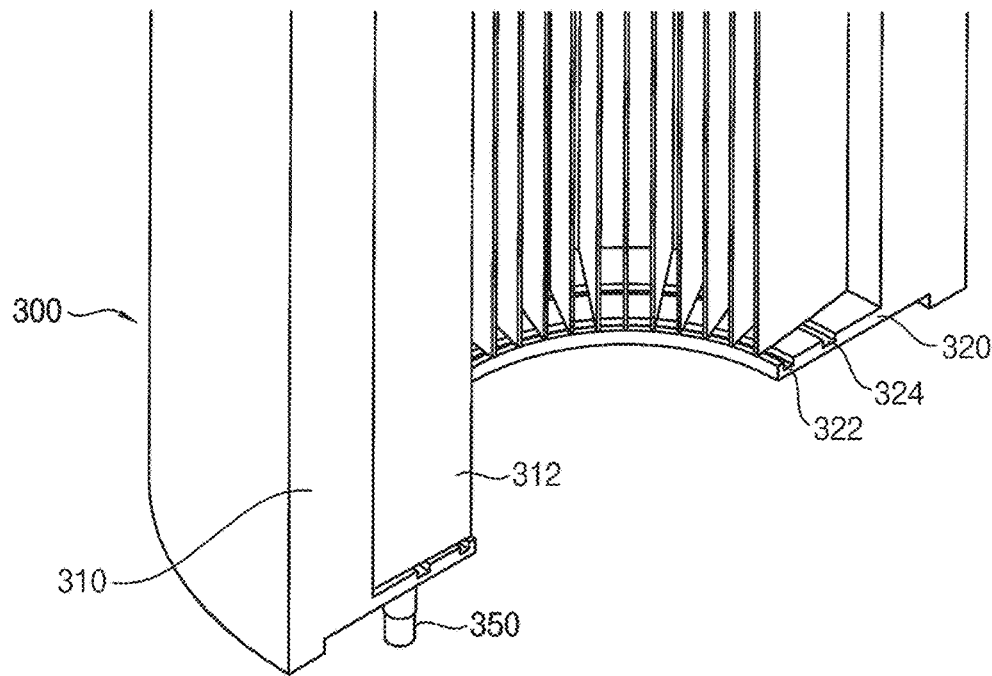
Figure 6:
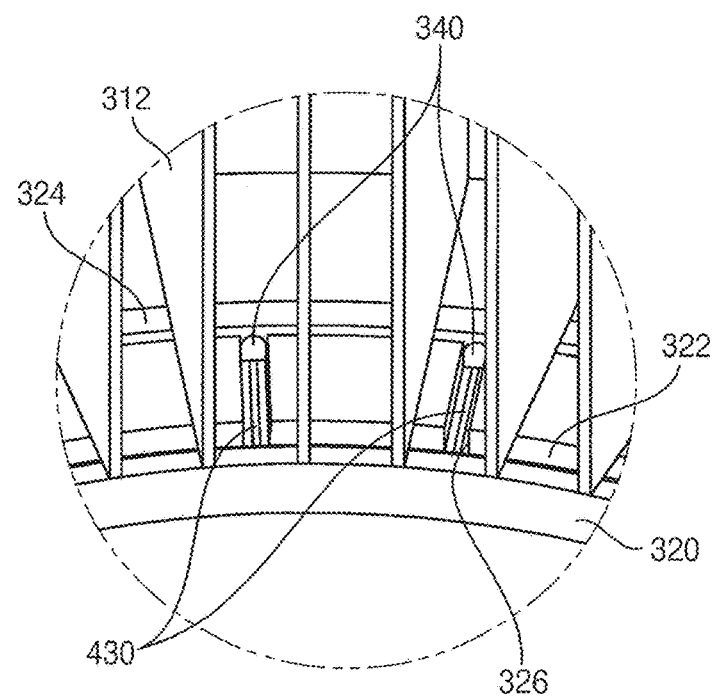
Figure 7:
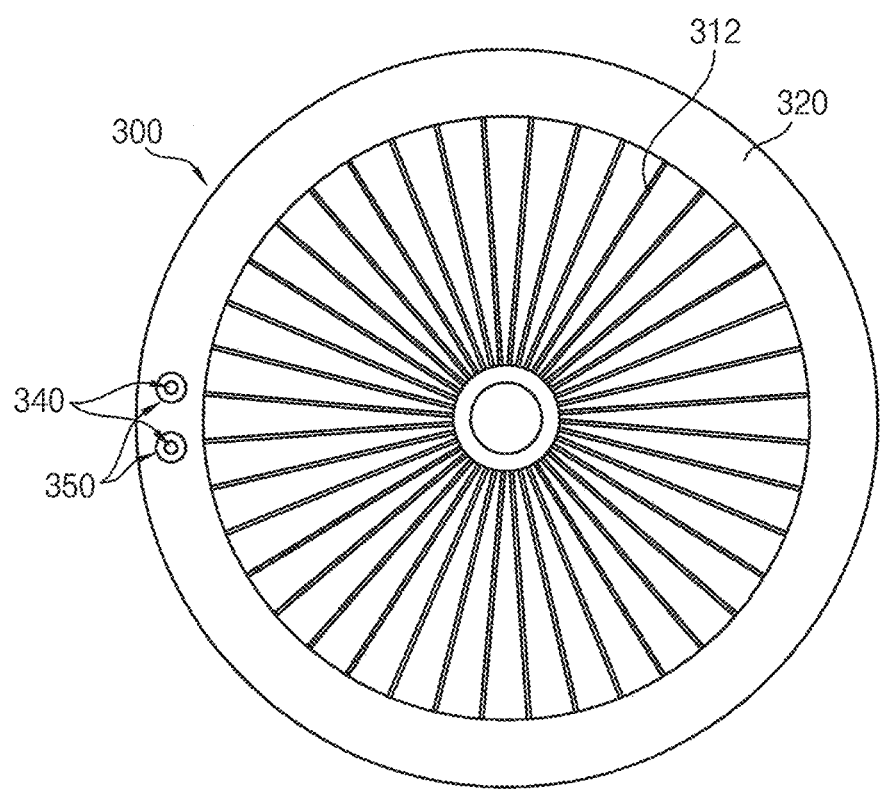
Figure 8:
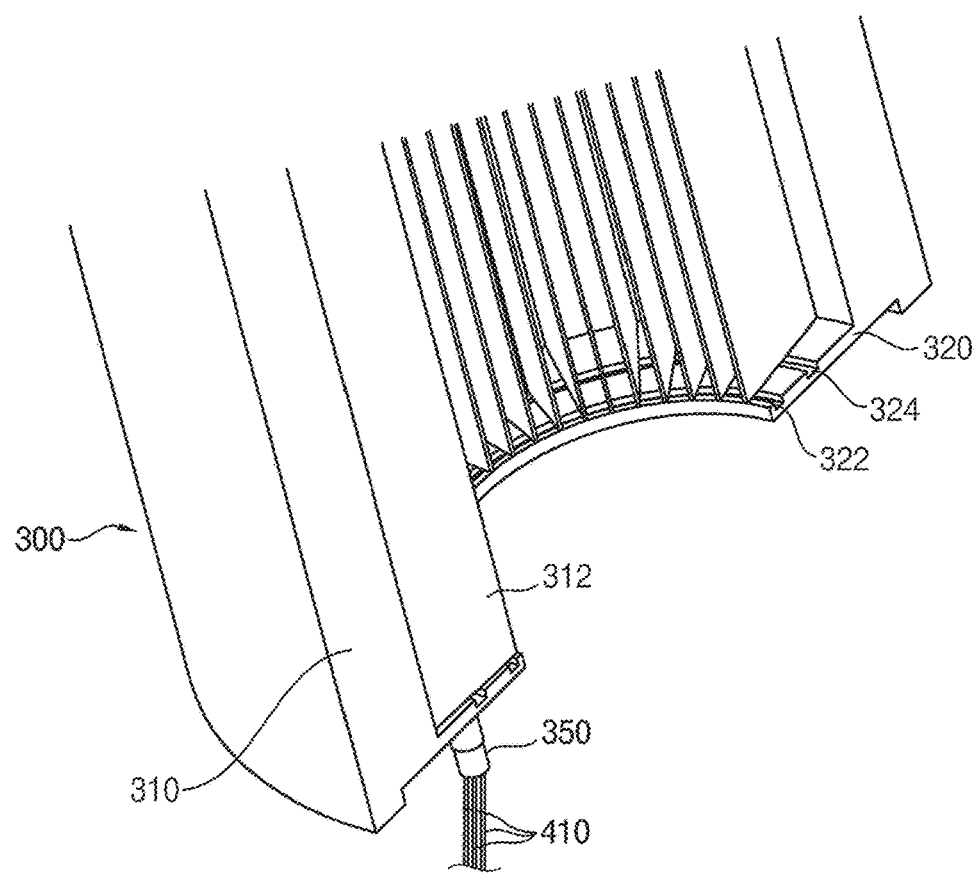
Figure 9:
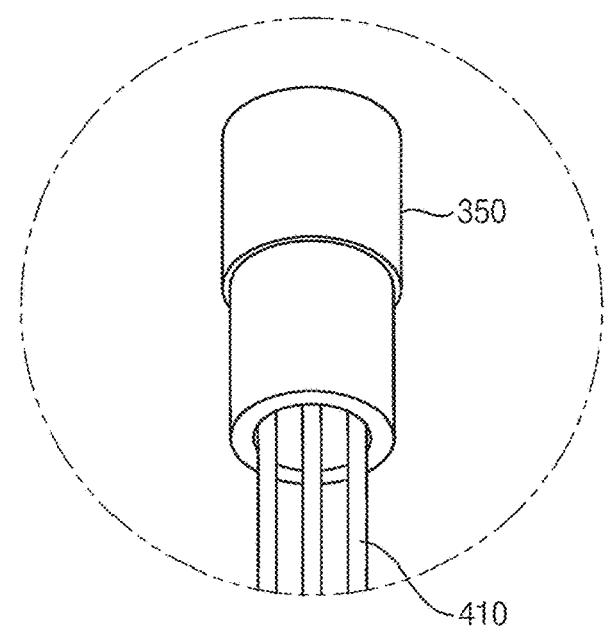
Figure 10:
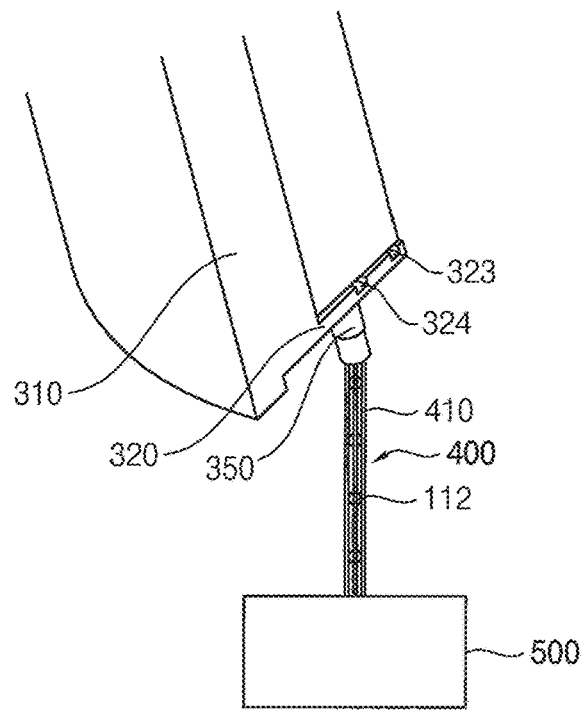

FIG. 3 is a cross-sectional view illustrating a target debris collection device in accordance with at least one example embodiment. FIG. 4 is a block diagram illustrating a heating device of the target debris collection device in FIG. 3 according to at least one example embodiment. FIG. 5 is a perspective view illustrating a portion of a baffle assembly of the target debris collection device in FIG. 3 according to at least one example embodiment. FIG. 6 is a perspective view illustrating a portion of a discharge plate of the baffle assembly in FIG. 5 according to at least one example embodiment. FIG. 7 is a bottom view of the baffle assembly in FIG. 5 according to at least one example embodiment. FIG. 8 is a perspective view illustrating a target debris collection device in accordance with at least one example embodiment. FIG. 9 is a perspective view illustrating a first heating member of the target debris collection device in FIG. 8 according to at least one example embodiment. FIG. 10 is a perspective view illustrating target material debris discharged along the first heating member of the target debris collection device in FIG. 8 according to at least one example embodiment.

Referring to FIGS. 3 to 10, a target debris collection device may include a baffle assembly 300 arranged within and/or included in a EUV vessel 200, and/or a guide unit configured to guide target material debris 112 collected in the baffle assembly 300 to a collection tank 500, but is not limited thereto. The baffle assembly 300 may include a baffle body 310, and/or a discharge plate 320, etc. The guide unit may include at least one heating member configured to impede and/or prevent the liquid target material debris 112 from becoming solidified, or in other words the at least one heating member heats the liquid target material debris 112 in order to decrease the occurrence of the liquid target material debris 112 from becoming solidified, etc.

In at least one example embodiment, the baffle body 310 may include a cone-shaped tube extending within the EUV vessel 200 from the collector 210 to the outlet port 202 of the EUV vessel 200, but is not limited thereto. The baffle body 310 may include a first end portion 311a adjacent to the collector 210 and a second end portion 311b opposite to the first end portion 311a and adjacent to the outlet portion 202, but the example embodiments are not limited thereto and may include a single end portion or three or more end portions, etc. The first end portion 311a may have a diameter greater than a diameter of the second end portion 311b, but is not limited thereto, and the first end portion 311a may have the same diameter as the second end portion 311b, etc. The extreme ultraviolet layer EL reflected from the collector 210 may be directed to the intermediate focus IF through the cone-shaped transmissive region 302 of the baffle body 310.

A plurality of vanes 312 may extend in an extending direction of the baffle body 310 on an inner wall of the baffle body 310. The vane 312 may protrude in a radial direction inwardly from the inner wall of the cone-shaped baffle body 310. The vanes 312 may surround the transmissive region 302, and may not protrude into the transmissive region 152, but is not limited thereto.

The baffle body 310 may be configured in a near vertical orientation, but is not limited thereto. A central line CL of the baffle body 310 may be oriented to be inclined at a desired and/or predetermined angle θ with respect to a gravity direction G. For example, the angle θ may be in a range of from 1 degree to 30 degrees, but is not limited thereto.

Additionally, as described later, the baffle body 310 may be heated by at least one other heating member, such as a fourth heating member 360. For example, the vanes 312 of the baffle body 310 may be heated to a temperature of about 100° C. to about 400° C., but the example embodiments are not limited thereto, and for example, the vanes 312 may be heated to a temperature appropriate to maintain the target material debris in liquid or semi-liquid form.

The discharge plate 320 may be provided in the first end portion 311a of the baffle body 310, but is not limited thereto. The discharge plate 320 may include a plate having an annular shape, but is not limited thereto. The vanes 312 may extend from an upper surface of the discharge plate 320 along the extending direction of the baffle body 310, but is not limited thereto.

The target material debris may be collected by the discharge plate 320 which is positioned at a relatively low level, e.g., the discharge plate 320 towards a location away from the outlet port 202 of the EUV vessel 200, etc., and the target material debris collected on the discharge plate 320 may be exhausted from the baffle assembly through a single passage or a series of passages.

For example, first and second discharge passages 322, 324 and a connection passage 326 connecting the first and second discharge passages may be formed in the upper surface of the discharge plate 320, and a discharge hole 340 connected thereto may be formed in the discharge plate 320, but the example embodiments are not limited thereto. The first and second discharge passages 322, 324 may be formed concentrically around the center of the discharge plate 320, but are not limited thereto. At least two discharge holes 340 may be formed in the discharge plate 320, but the example embodiments are not limited thereto, and for example, a single discharge hole may be present, etc. A discharge nozzle 350 may be installed in a lower surface of the discharge plate 320 to be connected to the discharge hole 340. The discharge nozzle 350 may protrude from the lower surface of the discharge plate 320. For example, the discharge nozzle 350 may have a diameter (D) between approximately 4 mm to 16 mm, but is not limited thereto.

In at least one example embodiment, a guide structure may be connected to the discharge nozzle 350 such that the target material debris 112 collected on the discharge plate 320 is guided to be discharged to the collection tank 500. Additionally, at least one first heating member may be provided in the guide structure to heat the liquid target material debris 112, and therefore impede, decrease the possibility of, and/or prevent the liquid target material debris 112 from becoming solidified.

As illustrated in FIGS. 6 to 10, the guide structure 400 may extend from the discharge plate 320 toward the collection tank 500. The guide structure 400 may include a plurality of heating lines 410 as the first heating member. The heating line 410 may extend in a direction parallel with the gravity direction from the discharge nozzle 350 toward the collection tank 500, but is not limited thereto. The heating line 410 may be the first heating member connected to a first power supply 450. Additionally, the heating line 410 may serve as at least a portion of the guide structure 400. In this case, an outer covering material (e.g., insulating or conductive material) of the heat line may serve as the guide structure 400.

For example, three heating lines 410 may be provided. The three heating lines 410 may be spaced apart from one another. In this case, the liquid target material debris 112 may run down between the three heating lines 410 to be collected in the collection tank 500.

The guide structure may have a length of approximately 100 mm to approximately 300 mm, but the example embodiments are not limited thereto. For example, the length of the guide structure may be determined in consideration of a distance between the discharge nozzle 350 and the collection tank 500, etc.

The first heating member 410 may be electrically connected to the first power supply 450. The liquid target material debris 112 may be heated by the first heating member 410 such that the liquid target material debris is collected in the collection tank 500 without becoming solidified.

As illustrated in FIG. 4, a second heating member 420 may be provided in the discharge nozzle 350 to heat the target material debris 112 to maintain the target material debris in a liquid or semi-liquid state, and therefore impede, decrease the occurrence of, and/or prevent the target material debris from becoming solidified. The second heating member 420 may include a heating line which surrounds the discharge nozzle 350. The second heating member 420 may be electrically connected to a second power supply 452.

A third heating member 430 may be provided in the passage of the discharge plate 320 to heat the target material debris 112 to maintain the target material debris in a liquid or semi-liquid state, and therefore impede, decrease the occurrence of, and/or prevent the target material debris from becoming solidified. The third heating member 430 may include a heating line which extends along the first and second discharge passages 322, 324 and the connection passage 326. The heating line may extend from the passage to the discharge hole 340. The third heating member 430 may be electrically connected to a third power supply 454.

The fourth heating member 360 may be provided in the baffle body 310 to heat the target material debris 112 to maintain the target material debris in a liquid or semi-liquid state, and therefore impede, decrease the occurrence of, and/or prevent the target material debris from being solidified. The fourth heating member 360 may include a heating line which surrounds the baffle body 310. The fourth heating member 360 may be electrically connected to a fourth power supply 352.

The first to fourth power supplies 450, 452, 454, 362 may be connected to a controller. The controller may control temperatures of the first to fourth heating members 410, 420, 430, 360 to heat the target material debris 112 to maintain the target material debris in a liquid or semi-liquid state, and therefore impede, decrease the occurrence of, and/or prevent the target material debris from becoming solidified.

As mentioned above, the target debris collection device may include the guide unit to guide target material debris 112 collected in the baffle assembly 300 to the collection tank 500. The guide unit may include the at least one heating member configured to heat the target material debris 112 to maintain the target material debris in a liquid or semi-liquid state, and therefore impede, decrease the occurrence of, and/or prevent the liquid target material debris 112 from being solidified.

Accordingly, the target material debris deposited on the EUV vessel 200 may be maintained in a liquid or semi-liquid state (e.g., not become solidified), and may be exhausted smoothly to the collection tank 500. Thus, maintenance time for removing the target debris material (e.g., tin material, etc.) deposited in the EUV vessel may be greatly reduced.

Figure 11:
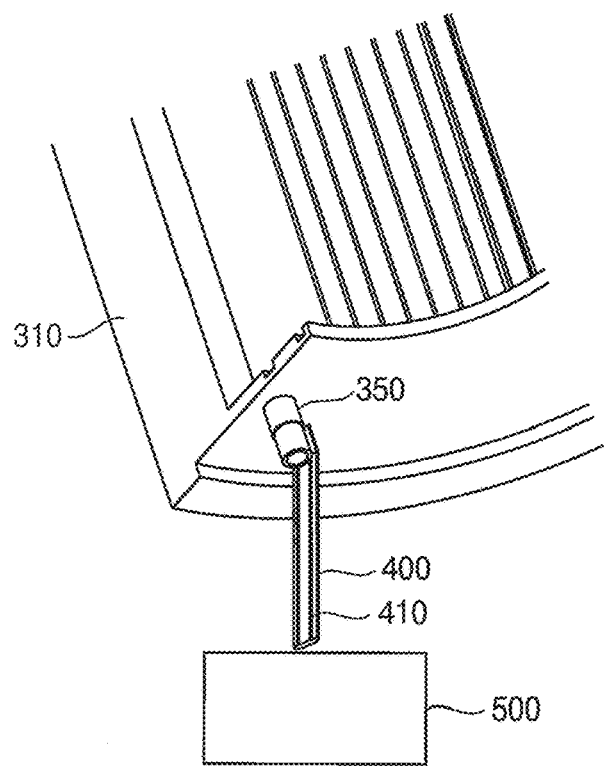

FIG. 11 is a perspective view illustrating a target debris collection device in accordance with at least one example embodiment. The target debris collection device may be substantially the same as or similar to the target debris collection device described with reference to FIGS. 3 to 10 except for a configuration of a guide unit. Thus, same reference numerals will be used to refer to the same or like elements and any further repetitive explanation concerning the above elements will be omitted.

Referring to FIG. 11, a target debris collection device may include a baffle assembly 300 arranged within a EUV vessel 200, a guide structure 400 configured to guide target material debris 112 collected in the baffle assembly 300 to a collection tank 500, and/or a first heating member 410 provided in the guide structure 400 to heat the target material debris 112 to maintain the target material debris in a liquid or semi-liquid state, and therefore impede, decrease the occurrence of, and/or prevent the liquid target material debris 112 from becoming solidified, etc.

In at least one example embodiment, the guide structure 400 may include a guide plate which extends from a discharge plate 320 toward the collection tank 500. For example, the guide plate may have a cross-section of circle or semi-circle, but is not limited thereto. The guide structure 400 may extend in a direction parallel with a gravity direction from a discharge nozzle 350 toward the collection tank 500.

The first heating member 410 may include a heating line which extends along the guide plate. The first heating member 410 may be electrically connected to a first power supply 450.

The guide plate may protect liquid target material debris 112 from deviating by a gas flowing within the EUV vessel 200 and may guide the liquid target material debris 112 to the collection tank 500. Accordingly, the guide plate may protect the liquid target material from being affected by the hydrogen gas current such that the liquid target material debris may be collected precisely into the collection tank 500.

The above extreme ultraviolet light source apparatus may be applied in applications such as a lithography apparatus for manufacturing semiconductor devices, however, the example embodiments are not limited thereto. The extreme ultraviolet light source apparatus according to at least one example embodiment may be applied to other photolithography processes, such as processes for manufacturing display devices such flat display, organic light emitting display, etc.

The foregoing is illustrative of various example embodiments and is not to be construed as limiting thereof. Although a few example embodiments have been described, those skilled in the art will readily appreciate that many modifications are possible in the example embodiments without materially departing from the novel teachings and advantages of the inventive concepts. Accordingly, all such modifications are intended to be included within the scope of the example embodiments as defined in the claims.

What is claimed is:

1. An extreme ultraviolet light source apparatus, comprising:
    a collector included in a vessel, the collector configured to reflect extreme ultraviolet light;
    a baffle assembly included in the vessel, the baffle assembly configured to allow the extreme ultraviolet light reflected from the collector to pass through an internal transmissive region of the baffle assembly, the baffle assembly including a baffle body and a discharge plate, the discharge plate provided in a first end portion of the baffle body adjacent to the collector, the discharge plate configured to collect the target material debris within the baffle body;
    a guide structure configured to guide target material debris collected in the baffle assembly to a collection tank; and
    a first heating member and a second heating member, the first heating member provided in the guide structure, the second heating member provided in the discharge plate, the first and second heating members configured to heat the target material debris.

2. The extreme ultraviolet light source apparatus of claim 1, wherein the first heating member comprises at least one heating line which extends from the baffle assembly to the collection tank, and the at least one heating line is included in the guide structure.

3. The extreme ultraviolet light source apparatus of claim 1, wherein the guide structure has a length between 100 mm to 300 mm.

4. The extreme ultraviolet light source apparatus of claim 1, wherein the guide structure extends along a direction of gravity.

5. The extreme ultraviolet light source apparatus of claim 1, wherein the guide structure comprises a guide plate which extends from the baffle assembly to the collection tank.

6. The extreme ultraviolet light source apparatus of claim 1, wherein
    the baffle body is between the collector and an outlet port of the vessel.

7. The extreme ultraviolet light source apparatus of claim 1, further comprising:
    a discharge nozzle installed in a discharge hole formed in the discharge plate, the discharge nozzle configured to be connected to the guide structure.

8. The extreme ultraviolet light source apparatus of claim 7, further comprising:
    a third heating member included in the discharge nozzle, the third heating member configured to heat the target material debris.

9. An extreme ultraviolet light source apparatus, comprising:
    a collector included in a vessel, the collector configured to reflect extreme ultraviolet light; and
    a target debris collection device configured to collect target material debris within the vessel,
    the target debris collection device comprises,
        a baffle body between the collector and an outlet port of the vessel, the baffle body configured to allow the extreme ultraviolet light reflected from the collector to pass through an internal transmissive region of the baffle body,
        a discharge plate provided in a first end portion of the baffle body adjacent to the collector, the discharge plate configured to collect the target material debris within the baffle body,
        a guide structure configured to guide the target material debris collected in the discharge plate to a collection tank, the guide structure having a length between 100 mm and 300 mm,
        a first heating member provided in the guide structure, the first heating member configured to heat the target material debris, and
        a second heating member provided in the discharge plate, the second heating member configured to heat the target material debris.

10. The extreme ultraviolet light source apparatus of claim 9, wherein the first heating member comprises at least one heating line which extends from the discharge plate to the collection tank.

11. The extreme ultraviolet light source apparatus of claim 9, wherein the guide structure extends along a direction of gravity.

12. The extreme ultraviolet light source apparatus of claim 9, wherein the guide structure comprises a guide plate which extends from the discharge plate to the collection tank.

13. The extreme ultraviolet light source apparatus of claim 9, wherein the target debris collection device further comprises a discharge nozzle installed in a discharge hole formed in the discharge plate, the discharge nozzle configured to be connected to the guide structure.

14. The extreme ultraviolet light source apparatus of claim 9, wherein the discharge plate has an annular shape extending along the first end portion of the baffle body.

15. The extreme ultraviolet light source apparatus of claim 9, further comprising:
    a purge gas supply portion configured to supply a purge gas into the collector.

16. A target debris collection device for extreme ultraviolet light source apparatus, comprising:
    a baffle body extending within an extreme ultraviolet (EUV) vessel between a collector and an outlet port of the EUV vessel, the baffle body configured to allow extreme ultraviolet light reflected from the collector to pass through an internal transmissive region of the baffle body;

a discharge plate provided in a first end portion of the baffle body adjacent to the collector, the discharge plate configured to collect target material debris on an inner surface of the baffle body;

a guide structure configured to guide the target material debris collected in the discharge plate to a collection tank;

a first heating member provided in the guide structure, the first heating member configured to heat the target material debris; and a second heating member provided in the discharge plate, the second heating member configured to heat the target material debris.

17. The target debris collection device for extreme ultraviolet light source apparatus of claim 16, further comprising:

a plurality of vanes extending from the baffle body on an inner wall of the baffle body.

18. The target debris collection device for extreme ultraviolet light source apparatus of claim 16, wherein the first heating member comprises at least one heating line which extends from the discharge plate to the collection tank.

19. The target debris collection device for extreme ultraviolet light source apparatus of claim 16, wherein the guide structure comprises a guide plate which extends from the discharge plate to the collection tank.

20. The target debris collection device for extreme ultraviolet light source apparatus of claim 16, further comprising:

a discharge nozzle installed in a discharge hole formed in the discharge plate, the discharge nozzle configured to be connected to the guide structure.

* * * * *